Feb. 4, 1958 E. E. FRANZ 2,821,959

MASS SOLDERING OF ELECTRICAL ASSEMBLIES

Filed March 29, 1956 2 Sheets-Sheet 1

INVENTOR
E. E. FRANZ DECEASED
ADA L. FRANZ
HIS EXECUTRIX
BY John C. Morris
ATTORNEY INVENTOR
E. E. FRANZ DECEASED
ADA L. FRANZ
HIS EXECUTRIX
BY John C Morris
ATTORNEY United States Patent Office 2,821,959

Patented Feb. 4, 1958

2,821,959

MASS SOLDERING OF ELECTRICAL ASSEMBLIES

Erwin E. Franz, deceased, late of Cranford, N. J., by Ada L. Franz, executrix, Cranford, N. J., assignor to Bell Telephone Laboratories, Incorporated, New York, N. Y., a corporation of New York Application March 29, 1956, Serial No. 574,848

3 Claims. (Cl. 118—302)

Figure 3:
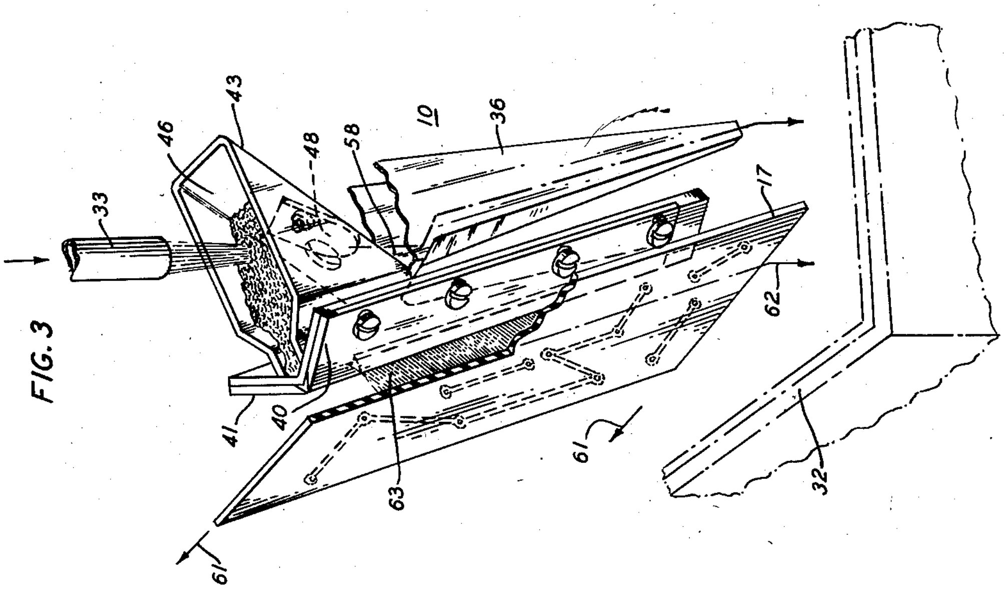

This invention relates to soldering and more particularly to the mass soldering of printed wiring boards.

Printed wiring boards of the type having a conductive pattern, generally referred to as a printed circuit, formed on one side of a rigid or semirigid sheet of insulating material and having an array of electrical components affixed to the other side have been generally accepted for inclusion in a wide variety of electrical apparatus, particularly in the electronics industry.

Several conventional techniques are used to interconnect the terminals of the electrical components and the printed circuit, generally involving holes or eyelets through the board to enable such interconnection. For example, in mounting electrical components having so-called "pigtail leads" for terminals, the leads are inserted through the boards and bent over against the opposite face of the board and into contact with a portion of the printed circuit. In order to assure both the secure mounting of the component and a good electrical connection solder is applied to each such interconnection point.

It has been found advantageous for a majority of printed wiring boards to solder coat the entire conductive metal pattern rather than attempt to apply solder to the individual electrical connections. This practice is termed mass soldering and serves the additional function of providing a protective coating for the printed circuit. In some instances mass soldering is accomplished both before and after the mounting of electrical components.

The most widely used technique has been to dip the entire printed wiring board surface having the conductive pattern thereon into a solder bath. This technique has certain disadvantages, even where efforts are made to employ a particularly distinctive method of applying the face of the board to the surface of the molten solder. Chief among these disadvantages, particularly with the conventional laminated plastic board, is the distortion and attendant deleterious effects produced by the heat of the solder bath and the presence of the necessary soldering flux. Also, unless precautions are taken the solder coating of the conductive pattern will be nonuniform or incomplete because of the presence of entrapped gases or vapors between the molten solder and the board itself. Furthermore, the technique of dipping in a bath has been for the most part a manual operation in which complete success is dependent upon the acquiring of some skill by the operator.

It is, therefore, an object of this invention to enable the solder coating of the conductive portions of printed wiring boards by simple, uniform, and rapid semiautomatic or automatic means.

It is a further object of this invention to enable the mass soldering of printed wiring boards having components mounted thereon in a facile manner with a minimum application of heat to the printed wiring board.

These and other objects of this invention are attained in one specific illustrative embodiment wherein printed wiring boards are movably mounted in an inclined position and pass adjacent a solder dispenser. In accordance with an aspect of this invention the solder dispenser is a funnel-shaped member having a slot in one side thereof. Two plates having beveled edges adjacent this slot are mounted by the funnel-shaped member and define a weir which feeds the molten solder in a relatively thin sheet against each board as it passes thereunder. Because only a narrow portion of the board is in contact with the solder at any instant and then for only a relatively short time, the board itself is not unduly heated and accordingly is not thermally distorted by the soldering process.

A head of solder is maintained in the funnel-shaped dispenser to allow ejection of the thin, narrow solder sheet in a horizontal direction against the printed wiring board. Accordingly, in the practice of my invention the boards need be only slightly inclined from a vertical position, which is desirable for the attainment of a uniform solder coating. The amount of solder flowing through the weir and the head of solder in the dispenser is proportioned by a cooperating overflow valve in the dispenser which serves to conduct excess solder to a reservoir.

Conventional apparatus may be utilized in the reservoir for maintaining the solder in a molten condition. The solder is circulated from the reservoir to the dispenser by a pump and a pipe having its open end situated directly above the solder dispenser.

To attain optimum positioning of the solder dispenser for coating the printed circuit boards by the thin, narrow sheet of solder emanating from the elongated weir in the solder dispenser, the location of the dispenser may be adjusted, both vertically and horizontally, and the inclination of the dispenser and the boards is also adjustable. In this way optimum results in uniformity and completeness of the solder coating are attained.

Therefore, a feature of this invention is a molten solder dispenser from which molten solder is applied to a printed wiring board in the form of a thin sheet. In accordance with this feature of the invention only a narrow portion of the board is subjected to soldering heat at one time.

It is a further feature of this invention that the printed circuit board be moved past the solder dispenser at a uniform rate so that the thin sheet of molten solder is uniformly swept across the face of the printed circuit board.

It is another feature of this invention that the solder dispenser have an elongated aperture in the surface thereof adjacent the printed circuit board, the aperture being shaped to define a weir through which the desired amount of solder emanates. Further, in accordance with a feature of this invention, the dispenser comprises at least one adjustable member having an edge defining an edge of the weir, whereby the dimensions of the weir may be adjusted.

It is still another feature of this invention that the dispenser be adjustably positioned with respect to the printed circuit boards to enable the most advantageous application of the solder stream upon the boards.

It is a still further feature of this invention that the printed circuit boards are supported in a position but slightly inclined from the vertical for application of the thin stream of molten solder. Further, the inclination of the solder dispenser and the boards may be adjusted to attain optimum coating of the boards by the solder.

Figure 1:
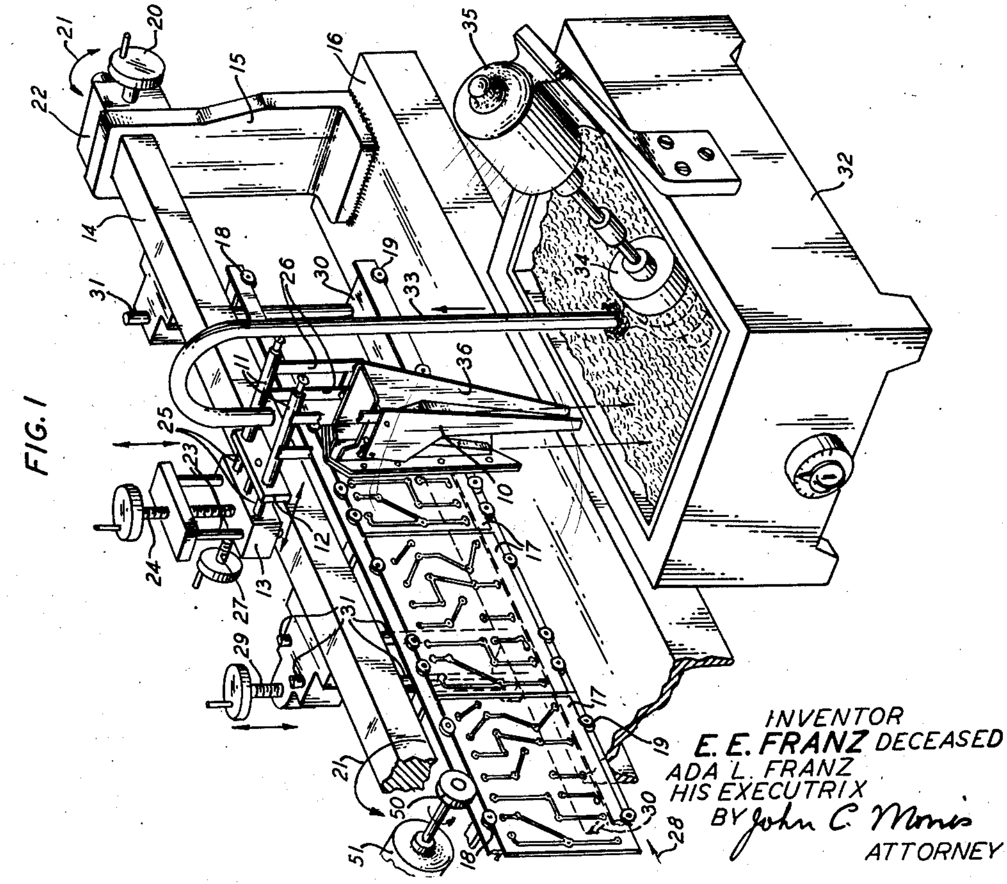
Figure 2:
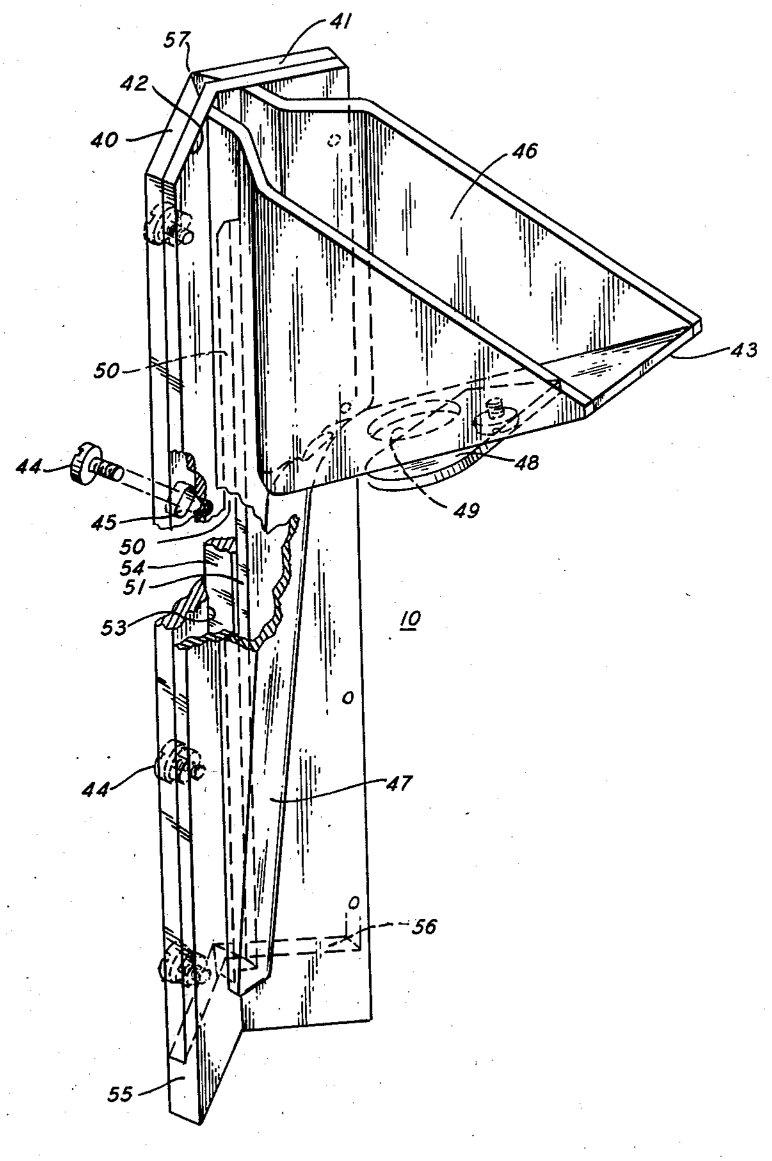

A better understanding of the invention and its objects and features will be had from the following detailed description taken in conjunction with the drawing, in which:

Fig. 1 is a perspective view of one specific illustrative embodiment of this invention depicting especially the solder dispenser, a portion of its mounting frame, the solder reservoir, and solder circulating means, with certain elements omitted for greater clarity;

Fig. 2 is a detail in perspective, partially broken away, of the dispenser head of the embodiment of Fig. 1, showing the particular arrangement of the weir plates; and Fig. 3 is a perspective of the solder dispenser and a printed wiring board both partially broken away, illustrating the manner in which the molten solder is applied to the printed wiring board for the specific embodiment depicted in Fig. 1.

In Fig. 1 the solder dispenser in accordance with this invention, is shown mounted from a support frame. One end of the support frame which may serve to mount certain drive elements has been omitted for greater clarity. The apparatus comprises a base member 16 and upright members 15, only one of which is shown, for supporting the longitudinal member 14. The member 14 is adapted for rotation, as indicated by the double-ended arrow 21, by turning the handwheel 20. The longitudinal member 14 is journalled in the upright member 15 and connected to the handwheel 20 through suitable shafts and gears housed within the gearbox 22.

An arrangement of crossheads, guide rods, and drive screws enable the vertical and horizontal movement of the solder dispenser relative to the rotatable member 14. Secured to the longitudinal member 14 are vertical guide rods 23 carrying the vertical crosshead 13 which is moved by the vertical drive screw 24. Horizontal guide rods 25 projecting from the crosshead 13 carry the horizontal crosshead 12 having sleeve members 11 affixed thereto. Rotation of the horizontal drive screw 27 moves the crosshead 12 and sleeve members 11. The dispenser 10 depends from the sleeve members 11 by means of the straps 26.

The printed wiring boards 17 are mounted in upper and lower roller tracks 18 and 19 enabling movement of the boards in the horizontal direction as indicated by the arrow 28. Various convenient arrangements may be used to feed the boards at a uniform and controllable rate. In Fig. 1 the boards are edge-driven by the roller 50, turned by the shaft-connected motor 51. The distance between the two roller tracks may be varied to accommodate boards of different widths by means of the adjusting screw 29 which moves the lower track support plate 30 up or down on the guide rods 31. The entire assembly for carrying the printed wiring boards is secured to and supported from the longitudinal member 14. Thus, the inclination of the boards is adjusted by rotation of the member 14, and the boards maintain a constant angular relation with the solder dispenser 10.

A constant flow of solder is supplied to the solder dispenser 10 from the heated reservoir 32 through the delivery pipe 33 by the pump 34 driven by the motor 35. Solder in excess of the amount required by the dispenser returns through the overflow trough 36 as will be described further in connection with Fig. 3. Similarly, excess solder drains from the board into the bath below. As is known in the art, polished or plated metal parts are used, for example, for the roller members 19 to inhibit unwanted adherence of the solder.

In Fig. 2 there is shown a detailed representation of the solder dispensing head 10 which consists of sharp edged weir plates 40 and 41 secured to a slotted plate member 42 having a solder feed funnel 43 integral therewith. The weir plates 40 and 41 are secured to the plate member 42 by means of screws 44. The elongated holes 45 in the weir plates 40 and 41 enable lateral adjustment of the plates to provide solder orifices of different widths.

The lower end of the support plate 42 includes a ledge portion 55 providing a shoulder 56 against which the ends of the support plates 40 and 41 abut. The central portion of this shoulder in effect provides one end of the spout through which the solder flows. Thus, the face of this shoulder prevents molten solder from "dribbling" out of the bottom of the dispenser.

The funnel 43 comprises a reservoir section 46 and a restricted portion 47 which assure a constant solder supply head to the dispenser opening. This constant head is maintained by adjusting the gate 48 to provide sufficient opening of the orifice 49 to drain off the excess supply. As more clearly shown in Fig. 3, this drain-off is conducted by means of a trough 36 to the molten bath.

The slot 50 in the support plate 42 is shown partially in dotted outline. In the partially broken away portion of this figure the arrangement of the edge 51 of the support plate 42, the slot 50 therein, and the opposed faces 53 and 54 of the weir plates 40 and 41, respectively, are more clearly shown. The planes of the opposing faces of the weir plates intersect at an acute angle as indicated at 57 to provide the outer sharp edges from which the solder stream is emitted.

The action of the dispenser 10 is best illustrated in Fig. 3 in which a printed wiring board 17 is shown in position as it moves along in juxtaposition to the dispenser 10. The flow of molten solder is shown leaving the delivery tube 33, the end portion of which is shown, and flowing into the reservoir portion 46 of the dispenser. The molten solder leaves the orifice formed by the weir plates 40—41 as a narrow sheet 63 which impinges upon the surface of the printed wiring board 17 which itself is moving transversely as indicated by the arrows 61.

It will be appreciated that there is a sufficient head of molten metal to provide the sheet of solder 63 issuing from the restricted orifice with sufficient velocity to produce a horizontal component toward the board. Thus, the solder sheet is emitted outwardly as well as down against the printed wiring board, thereby enabling positioning of the board in a relatively vertical plane which is generally more conducive to a uniform solder coating.

The excess solder flows from the board 17, as indicated by the arrow 62 at the bottom of the board, and into the reservoir 32 indicated below the dispenser 10, partially in phantom outline. Also shown in dotted outline is the overflow gate 48 which is shown partially open, permitting a small stream 58 of the molten metal to escape. This excess flows down the overflow trough 36 and likewise returns to the reservoir 32.

It will be appreciated from this particular figure that a restricted amount of heat is applied to the board as a result of the thin solder sheet which, in effect, traverses the board at a steady rate, thereby subjecting but a very small portion of the board to a high heat at any given time.

It will be obvious that certain other apparatus advantageous to the practice of this invention has not been included in the interest of clarity. Thus, it will be appreciated that other means may be provided in conjunction with the conveyor arrangement for the printed boards, for cleaning the boards both before and after soldering, applying flux, and removing excess solder; all of which may be associated with the soldering head described herein. In addition, heating means may be intimately associated with the dispenser to assure the correct molten condition of the solder throughout the cycle, Further, as is well known in the art, it may be found advantageous to dispense with the use of flux and to employ supersonic agitation in lieu thereof. This may be accomplished by applying high frequency vibrations to either the board or to the dispenser. Removal of excess solder may be accomplished by such means as the use of a hot air levelling blast for insuring the removal of unwanted globules from the surface of printed wiring boards. The solder dispensing arrangement of this invention thus is well adapted for incorporation in an assembly line in which the various functions of assembling and solder coating printed wiring boards are all achieved by automatic means after the various means for initial positioning of the machine elements have been determined. Furthermore, it will be appreciated that although an embodiment has been described in which the printed wiring boards move past the stationary solder dispenser, other arrangements may be made having the dispenser in motion, all of which result in relative lateral motion between the boards and the dispenser.

Although a specific embodiment of the invention has been shown and described, it will be understood that it is but illustrative and that various modifications may be made therein without departing from the scope and spirit of the invention.

What is claimed is:

1. Apparatus for mass soldering printed wiring boards comprising a base member, upright members on said base member, a longitudinal support member rotatably mounted by said upright members, means for rotating said longitudinal member, a substantially funnel-shaped molten solder dispenser suspended from said longitudinal member, said dispenser having a vertically disposed solder orifice in a side thereof, means for varying the horizontal dimension of said orifice, vertical and horizontal screw means for movably positioning said dispenser relative to said longitudinal member, said longitudinal member having suspended therefrom upper and lower roller tracks for mounting a series of printed wiring boards in juxtaposition to said dispenser and including screw means for varying the distance between said upper and lower tracks, a heated reservoir for maintaining a supply of molten solder, and means for delivering said molten solder to said dispenser comprising a pump and delivery pipe.

2. Apparatus for solder coating printed circuit boards comprising means for mounting the boards in a position inclined from the vertical, a substantially funnel-shaped dispenser having a vertically disposed orifice in the side thereof towards said boards, said orifice having bevelled edges therein to provide a sharp-edged boundary, means mounting said dispenser adjacent said boards, at least one adjustable plate member having an edge bounding the long dimension of said orifice, means for supplying molten solder to said dispenser, and means for attaining relative lateral motion between said boards and said dispenser.

3. Apparatus for mass soldering printed wiring boards comprising a base member, upright members on said base member, a longitudinal support member rotatably mounted by said upright members, means for rotating said longitudinal member, a substantially funnel-shaped molten solder dispenser suspended from said longitudinal member, said dispenser having a vertically disposed solder orifice in a side thereof, means for varying the horizontal dimension of said orifice, vertical and horizontal screw means for movably positioning said dispenser relative to said longitudinal member, said positioning means comprising a vertical drive screw mounted from said longitudinal member, a vertical crosshead on said vertical drive screw, a horizontal drive screw fixed in said vertical crosshead member and a horizontal crosshead member mounted on said horizontal drive screw and sleeve members mounted on said horizontal crosshead member for supporting said molten solder dispenser, said longitudinal member having suspended therefrom upper and lower roller tracks for mounting a series of printed wiring boards in juxtaposition to said dispenser and including screw means for varying the distance between said upper and lower tracks, a heated reservoir for maintaining a supply of molten solder, and means for delivering said molten solder to said dispenser comprising a pump and delivery pipe.

References Cited in the file of this patent

UNITED STATES PATENTS

| | | |
|---|---|---|
| 1,724,179 | Bullerjahn | Aug. 13, 1929 |
| 1,872,507 | Saunders et al. | Aug. 16, 1932 |
| 2,235,978 | Braucher | Mar. 25, 1941 |
| 2,279,686 | Kerlin | Apr. 14, 1942 |
| 2,440,084 | Goda | Apr. 20, 1948 |
| 2,655,066 | Siegerist | Oct. 13, 1953 |
| 2,708,417 | Nieter | May 17, 1955 |
| 2,733,171 | Ransburg | Jan. 31, 1956 |